United States Patent
Eichner et al.

(10) Patent No.: US 10,605,882 B2
(45) Date of Patent: Mar. 31, 2020

(54) SYSTEMS AND METHODS FOR REMOVING BACKGROUND PHASE VARIATIONS IN DIFFUSION-WEIGHTED MAGNETIC RESONANCE IMAGING

(71) Applicant: THE GENERAL HOSPITAL CORPORATION, Boston, MA (US)

(72) Inventors: Cornelius Eichner, Charlestown, MA (US); Kawin Setsompop, Charlestown, MA (US); Lawrence Wald, Cambridge, MA (US); Stephen Cauley, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 290 days.

(21) Appl. No.: 15/314,210

(22) PCT Filed: May 29, 2015

(86) PCT No.: PCT/US2015/033123
§ 371 (c)(1),
(2) Date: Nov. 28, 2016

(87) PCT Pub. No.: WO2015/184226
PCT Pub. Date: Dec. 3, 2015

(65) Prior Publication Data
US 2017/0108570 A1  Apr. 20, 2017

Related U.S. Application Data

(60) Provisional application No. 62/005,599, filed on May 30, 2014.

(51) Int. Cl.
*G01R 33/565* (2006.01)
*G01R 33/563* (2006.01)
*G01R 33/56* (2006.01)

(52) U.S. Cl.
CPC ..... *G01R 33/56545* (2013.01); *G01R 33/565* (2013.01); *G01R 33/5608* (2013.01); *G01R 33/56341* (2013.01)

(58) Field of Classification Search
CPC combination set(s) only.
See application file for complete search history.

(56) References Cited

U.S. PATENT DOCUMENTS

| 9,911,062 B1 * | 3/2018 | Ahmad | G06K 9/52 |
| 2002/0042569 A1 * | 4/2002 | Wedeen | A61B 5/055 600/411 |

(Continued)

OTHER PUBLICATIONS

Van et al.; "Motion Induced Phase Error Estimation and Correction in 3D Diffusion Tensor Imaging"; Nov. 2011; IEEE transactions on medical imaging; vol. 30; No. 11 (Year: 2011).*

(Continued)

*Primary Examiner* — Jay Patidar
(74) *Attorney, Agent, or Firm* — Quarles & Brady LLP

(57) ABSTRACT

Systems and methods for performing diffusion-weighted magnetic resonance imaging ("MRI"), including reconstructing and analyzing images, while preserving phase information that is traditionally discarded in such applications, are provided. For instance, background phase variations are eliminated, which enables complex-valued data analysis without the usual noise bias. As a result, the systems and methods described here provide an image reconstruction that enables true signal averaging, which increases signal-to-noise ratio ("SNR") and allows higher contrast in diffusion model reconstructions without a magnitude bias.

14 Claims, 2 Drawing Sheets

(56) References Cited

U.S. PATENT DOCUMENTS

| | | |
|---|---|---|
| 2011/0263962 A1 | 10/2011 | Marks |
| 2012/0002078 A1 | 1/2012 | Nakamura et al. |
| 2012/0049846 A1 | 3/2012 | Gross et al. |
| 2012/0155730 A1 | 6/2012 | Metaxas et al. |
| 2012/0319686 A1 | 12/2012 | Jesmanowicz et al. |
| 2013/0085637 A1 | 4/2013 | Grimm et al. |
| 2013/0181712 A1* | 7/2013 | Sutton .............. G01R 33/56341 324/314 |
| 2014/0226890 A1 | 8/2014 | O'Brien et al. |
| 2015/0154741 A1* | 6/2015 | Chen ................... G01R 33/543 348/77 |
| 2018/0089863 A1* | 3/2018 | Marschner ......... G01R 33/5608 |

OTHER PUBLICATIONS

The International Search Report and Written Opinion as dated Aug. 31, 2015 for International Application No. PCT/US2015/033123.

* cited by examiner

SYSTEMS AND METHODS FOR REMOVING BACKGROUND PHASE VARIATIONS IN DIFFUSION-WEIGHTED MAGNETIC RESONANCE IMAGING

CROSS-REFERENCE TO RELATED APPLICATIONS

This application represents the U.S. National Stage of International Application No. PCT/US2015/033123, filed May 29, 2015 which claims the benefit of U.S. Provisional Application Ser. No. 62/005,599, filed May 30, 2014, both of which are incorporated herein by reference for all purposes.

STATEMENT REGARDING FEDERALLY SPONSORED RESEARCH

This invention was made with government support under MH093765, EB015896, and EB012107 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for preserving phase information in diffusion-weighted MRI, including diffusion tensor imaging ("DTI"), diffusion spectrum imaging ("DSI"), q-ball imaging ("QBI"), and the like.

Diffusion-weighted MRI ("dMRI") is a useful too for providing valuable neuroscientific and clinical information. In dMRI, magnetic resonance signals are sensitized to anisotropic water diffusion through localized signal attenuation. Diffusion MRI models, such as DTI, DSI, and QBI can use this diffusion weighting dependent signal attenuation to obtain structural tissue information.

A magnetic resonance signal is complex-valued and, therefore, includes both magnitude and phase components. During the diffusion encoding process, which is realized by applying magnetic field gradients in specific directions, physiological and other motion sources can cause smooth phase variations across the acquired complex image. Examples of such physiological motion sources includes brain motion, cardiac motion, and respiratory motion.

These background phase variations do not have an impact on the magnitude of the image; thus, diffusion MRI commonly uses magnitude-only images, which are insensitive to these background phase variations. A drawback of using magnitude-only images arises, however, when multiple such images are combined in some way. For example, if the multiple images are combined (e.g., added) and used for model fitting or signal averaging, the magnitude noise tends to accumulate in a way that zero-mean noise (where half the fluctuations are positive and half are negative) does not. This accumulation of noise is generally not an issue if the signal-to-noise ratio ("SNR") of the acquired image is high because the distribution of noise approximates a Gaussian distribution in such cases. In diffusion-weighted MRI and other low SNR modalities, however, signal averaging can accumulate non-Gaussian noise, which results in biased data points at low signal intensities.

Thus, in these low signal-to-noise ratio ("SNR") cases, where many low SNR images are combined, there is a severe penalty to combining magnitude images compared to complex images. This is exactly the regime in which diffusion MRI analysis is situated. Namely, hundreds of low-SNR magnitude images are typically acquired with different diffusion directions, after which these images are used as the source to various computed images. As a result, diffusion modeling of signal gets less accurate in low SNR regions because noise has a strong influence on signal attenuation. This influence of the noise leads to incorrect or biased model fits.

Combining low SNR magnitude images in an attempt to improve SNR, such as by using signal averaging, is also problematic because the signal averaging assumes a Gaussian noise distribution with a zero mean. But, noise in magnitude data follows a non-central chi-square distribution with a non-zero mean. As a result, the signal averaging leads to a strong influence of noise and an artifact in terms of signal bias, yielding low contrast in averaged images. For complex-valued signals, averaging is only a valid concept if carried out in the complex domain, which is not directly possible because background phase contamination destroys signal coherence of the phase.

A recent attempt at reducing the background phase contamination in diffusion-weighted MRI was discussed by S. J. Holdsworth, et al., in "Diffusion tensor imaging (DTI) with retrospective motion correction for large-scale pediatric imaging," *J. Magn. Reson. Imaging*, 2012; 36:961-971. In this approach, the acquired k-space data is apodized using a triangular window filter having a fixed size (e.g., 25 percent of k-space). Because this approach removes the higher spatial frequencies in k-space, spatial resolution in the resultant images is reduced. This reduction in spatial resolution can result in missing fast-changing phase variations, such as those that typically occur at tissue borders or where significant subject motion results in rapid phase changes. As a consequence, these fast phase variations may not be estimated or otherwise removed. Another drawback of this method is that stronger diffusion weightings (i.e., higher b-values) result in more phase variations, which also might not be estimated or otherwise removed based on the apodization of k-space.

Another attempt at reducing the background phase contamination in diffusion-weighted MRI was proposed by J. I. Sperl, et al., in "Phase Sensitive Reconstruction in Diffusion Spectrum Imaging Enabling Velocity Encoding and Unbiased Noise Distribution," *In Proceedings of the 21st annual meeting of ISMRM*, Salt Lake City, 2013; p. 2054. This approach utilized a low-order polynomial fitting and subtraction of the image phase across image space, and a linear fitting and subtraction of the phase evolution across diffusion space (i.e., "q-space"). The low-order polynomial fitting used in this approach may be valid for low b-values, but it is not a reliable approach when larger b-values are used because with higher b-values, background phase contamination becomes increasingly complicated and therefore harder to fit with a low-order polynomial term. The polynomial fitting is also not as reliable at resolving phase jumps at tissue borders. Another drawback with this method is that a large range of q-space has to be covered (i.e., multiple diffusion directions and weightings need to be acquired).

After removing the polynomial phase term in image space, a linear term across the different b-values (i.e., in q-space) is estimated using a linear fitting. This two-step approach removes the linear term after the background phase is removed in the first step. There is reason to believe, however, that the polynomial phase term and the linear phase term are not independent of each other; thus, a two-step approach of estimating and removing these effects is likely to introduce errors in the final reconstruction.

In light of the foregoing, there remains a need to provide a reconstruction algorithm for diffusion-weighted MRI that is capable of reliably estimating and removing undesired background phase variations, such that complex-valued data can be utilized in diffusion analyses, such as diffusion tensor calculations and tractography methods.

SUMMARY OF THE INVENTION

The present invention overcomes the aforementioned drawbacks by providing a method for producing an image, in which background phase variations are removed, from data acquired using a magnetic resonance imaging ("MRI") system. Diffusion-weighted data that was acquired with an MRI system is provided, from which a complex-valued image is reconstructed. Background phase variations are estimated based on the reconstructed complex-valued image. A complex-valued, phase-corrected image is then produced by removing the estimated background phase variations from the reconstructed complex-valued image.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
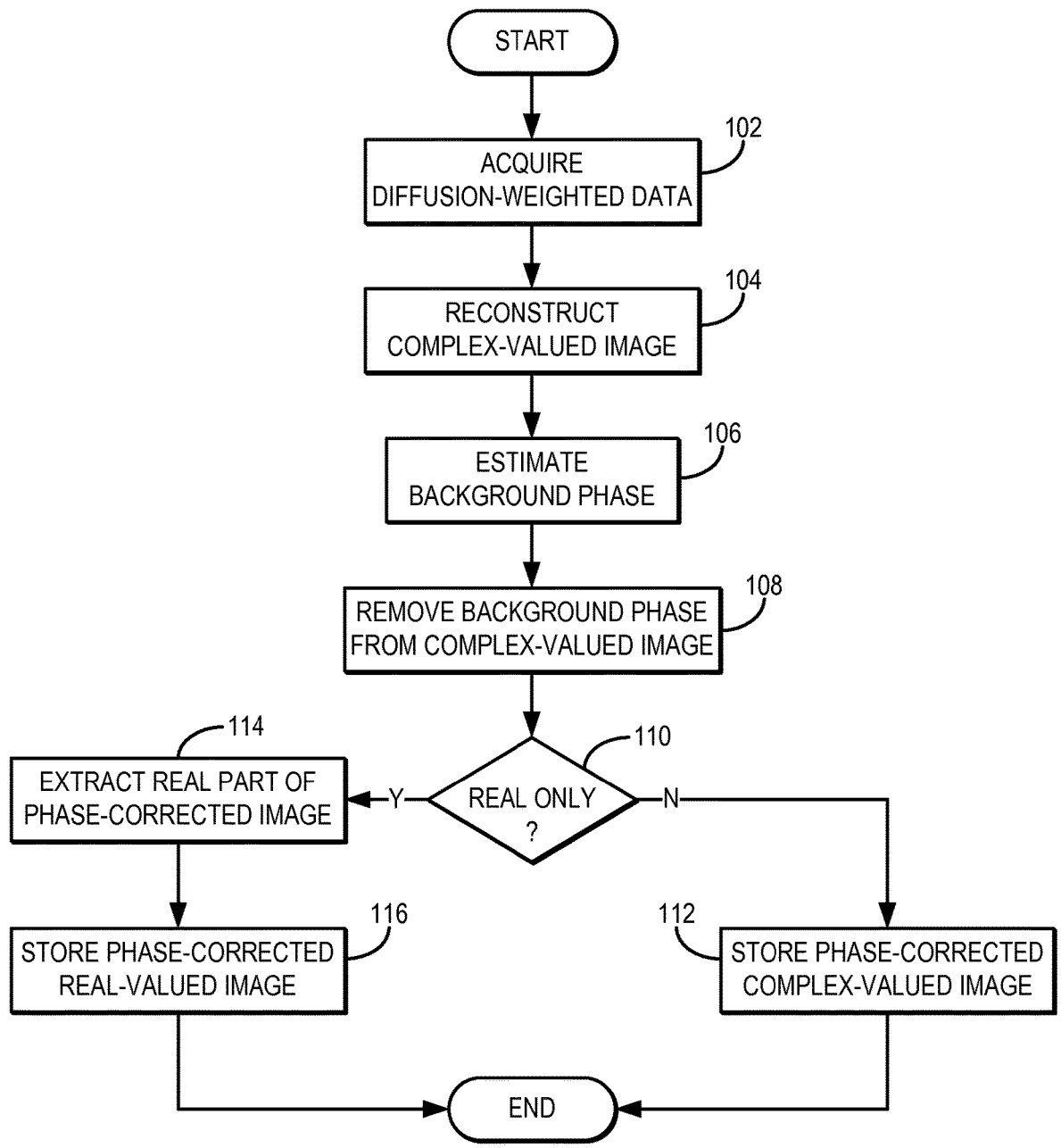
FIG. 1 is a flowchart setting forth the steps of an example method for estimating and removing background phase variation from complex-valued data, such as diffusion-weighted data.

Described here are systems and methods for performing diffusion-weighted magnetic resonance imaging ("MRI"), including reconstructing and analyzing images, while preserving phase information that is traditionally discarded in such applications. For instance, the systems and methods described here are capable of eliminating background phase variations and, therefore, can enable complex-valued data analysis without undesirable noise bias. As a result, the systems and methods described here provide an image reconstruction that enables true signal averaging, which increases signal-to-noise ratio ("SNR") and allows higher contrast in diffusion model reconstructions without a magnitude bias.

In general, the systems and methods described here model the spatial dependence of the undesired, background phase variations in a low SNR diffusion-weighted sub-image. This undesired signal phase has a complex spatial pattern, which is different from shot-to-shot based on respiratory effects and other micro-motions of the tissue, subject, or both. Although the undesired phase signal has a complicated spatial pattern, the undesired signal phase is separable from the true thermal noise phase, which is uncorrelated from pixel-to-pixel. As a result, the undesired signal phase can be subtracted, or otherwise removed, from the acquired signals to leave only the thermal noise phase. Removing the undesired signal phase leaves a complex image whose real part contains the image signal plus the real part of the thermal noise, and whose imaginary component contains only the imaginary component of the thermal noise.

This complex image can be used for the analysis of the diffusion information, such as neural fiber orientation and diffusion parameters in healthy or clinical populations (e.g., brain stroke, hemorrhage), rather than the traditional approach of analyzing a magnitude-only image. As a result, the magnitude noise accumulation problem described above is avoided. If desired, the imaginary component can even be set to zero to reduce the effect of the thermal noise.

Complex-valued diffusion-weighted magnetic resonance data is contaminated with background phase variations that arise from magnetic field inhomogeneities, eddy currents, respiratory effects, cardiac motion, and coherent motion, such as brain perfusion. As a result of these variations, complex-valued MRI signals, I, are a superposition of the underlying magnitude signal, $I_0$; a tissue phase, $\phi_0$; and a spatially smooth background phase, $\phi_{BG}$ that varies for each slice, diffusion direction, and time point. The complex-valued MRI signals can be modeled as, $$I(r)=I_0(r)e^{i\phi_0(r)}e^{i\phi_{BG}(r)} \qquad (1).$$

In a standard reconstruction of magnitude images, the background phase variations do not have an impact on the final image because the signal phase information is removed from the images. In order to use full complex data in diffusion MRI applications, the background phase variations need to be removed. Removing these background phase variations results in a coherent signal in the real part of the data.

The image reconstruction described here employs a denoising algorithm, which may include a filtering algorithm, to estimate the background phase, $\phi_{BG}$. By estimating this phase, it can be removed from complex-valued images, thereby preserving useful phase information that is traditionally discarded.

Background phase is generally smooth in image space, with jumping points at tissue borders. Based on its smoothness in image space, the background phase can be estimated from each diffusion-weighted dataset by using an appropriate denoising algorithm. If denoising parameters are set correctly, the phase of the denoised dataset resembles the diffusion background phase, $\phi_{BG}$.

In some embodiments, an $l_1$-regularized total variation ("TV") denoising algorithm can be used to estimate the background phase, $\phi_{BG}$. For instance, such a denoising algorithm can have the following form:

$$\min_{I_{BG}}\{\|I_{BG} - I\|_2^2 + \lambda \|\nabla_r I\|_1\}; \qquad (2)$$

where $I_{BG}$ is the component of the denoised magnetic resonance signals that is attributable to the background phase, $\phi_{BG}$. It will be appreciated by those skilled in the art that denoising algorithms other than TV denoising can readily be used to estimate the background phase, $\phi_{BG}$, without departing from the scope of the invention. As one example, median filtering can also be used to estimate the background phase, $\phi_{BG}$.

The denoised data follow a smooth phase variation, $\phi_{BG}$, which can be used for pointwise background phase correction in each voxel to form a phase corrected dataset, $I_{corr}$, according to $$I_{corr} = I \cdot \left(\frac{I_{BG}^*}{|I_{BG}|}\right) = I \cdot e^{-i\phi_{BG}}. \quad (3)$$

Referring now to FIG. 1, a flowchart is illustrated setting forth the steps of an example method for reconstructing and processing a diffusion-weighted image for use in diffusion analyses, including diffusion tensor calculations and fiber tractography computations.

First, complex-valued diffusion-weighted data are acquired, or otherwise provided, as indicated at step 102. The data can be acquired using any suitable diffusion-weighted MRI technique, including diffusion tensor imaging ("DTI"), diffusion spectrum imaging ("DSI"), and q-ball imaging ("QBI"). In some instances, the data can already be acquired and thus can be provided by retrieving the already acquired data from storage. By way of example, data may be acquired using a twice-refocused DSI pulse sequence, in which data are acquired with isotropic resolution of 2.4× 2.4×2.4 mm$^3$ and to cover a half spherical diffusion q-space with 256 diffusion directions using a maximum b-value of b=7000 s/mm$^2$. After the data are acquired, or otherwise provided, complex-valued images are reconstructed, as indicated at step 104. In some embodiments, reconstructing the complex-valued images may include reconstructing low signal-to-noise ratio ("SNR") sub-images that are also complex-valued.

The undesired, background phase is estimated from the reconstructed images, as indicated at step 106. For instance, the background phase can be estimated by using a denoising algorithm that is designed to extract the undesired background phase. In some embodiments, the denoising algorithm is applied to low SNR sub-images. Because background phase varies significantly between measurements, the denoising algorithm is preferably applied in two-dimensional space for each slice if the slices are acquired separately. The denoising algorithm can include an l$_1$-regularized TV denoising algorithm, such as the one described above. The denoising algorithm can also include any number of suitable filtering algorithms, including a median filtering algorithm.

After the background phase has been estimated, it is removed from the reconstructed images, as indicated at step 108. As one example, the background phase can be removed using a multiplicative factor that is based on the estimated background phase. As another example, the background phase can be subtracted from the reconstructed images.

A decision is then made as to whether to maintain the phase-corrected images as complex-valued images, or whether to keep only the real component of the images, as indicated at decision block 110. If the images are to be kept as complex-valued images, then the complex-valued, phase-corrected images are stored for later use, as indicated at step 112. If, however, only the real component of the phase-corrected images is to be kept, the real part of the images is extracted, as indicated at step 114. As one example, the real part can be extracted by zeroing the imaginary part, as described above. After the real parts of the phase-corrected images have been extracted, they are stored as real-valued, phase-corrected images, as indicated at step 116.

The stored, phase-corrected images can then be processed using the desired diffusion MRI analysis, which may include computing diffusion tensors are related metrics, performing tractography, and so on.

Thus, the reconstruction method described above provides a way to eliminate undesirable noise bias inherent in magnitude images produced from low SNR MRI data, such as diffusion MRI, by enabling the use of complex-valued or real-valued data. In some embodiments, the reconstruction method can be applied to non-diffusion-weighted MRI data, such as data acquired using dynamic susceptibility contrast imaging techniques. As noted above, the output of the reconstruction can either be complex-valued or real-valued. Having such data, averaging can be employed to increase SNR. Furthermore mathematical models based on signal intensity will perform more accurately in low SNR datasets.

In some embodiments, the reconstruction method described above can be combined with computational optimization algorithms and statistical data analysis in such a way that the phase-corrected signals will follow an expected optimal distribution of values. For example, in the optimal case, the imaginary component of the corrected signals will not contain any information except for Gaussian noise and, therefore, be normally distributed. As another example, if the phase correction corrects for both background phase and image noise, the real values of the data would start to follow a non-zero chi-square distribution. If such desirable and undesirable characteristics of the corrected data are considered, it is possible to implement an online optimization in such a way that the imaginary data will optimally follow a Gaussian distribution and the real-valued data will not follow a chi-square distribution. Such an optimization will result in optimal phase correction of the background data. The suggested algorithm using TV background estimation is more flexible in terms of achieving such an optimized phase correction.

Figure 2:
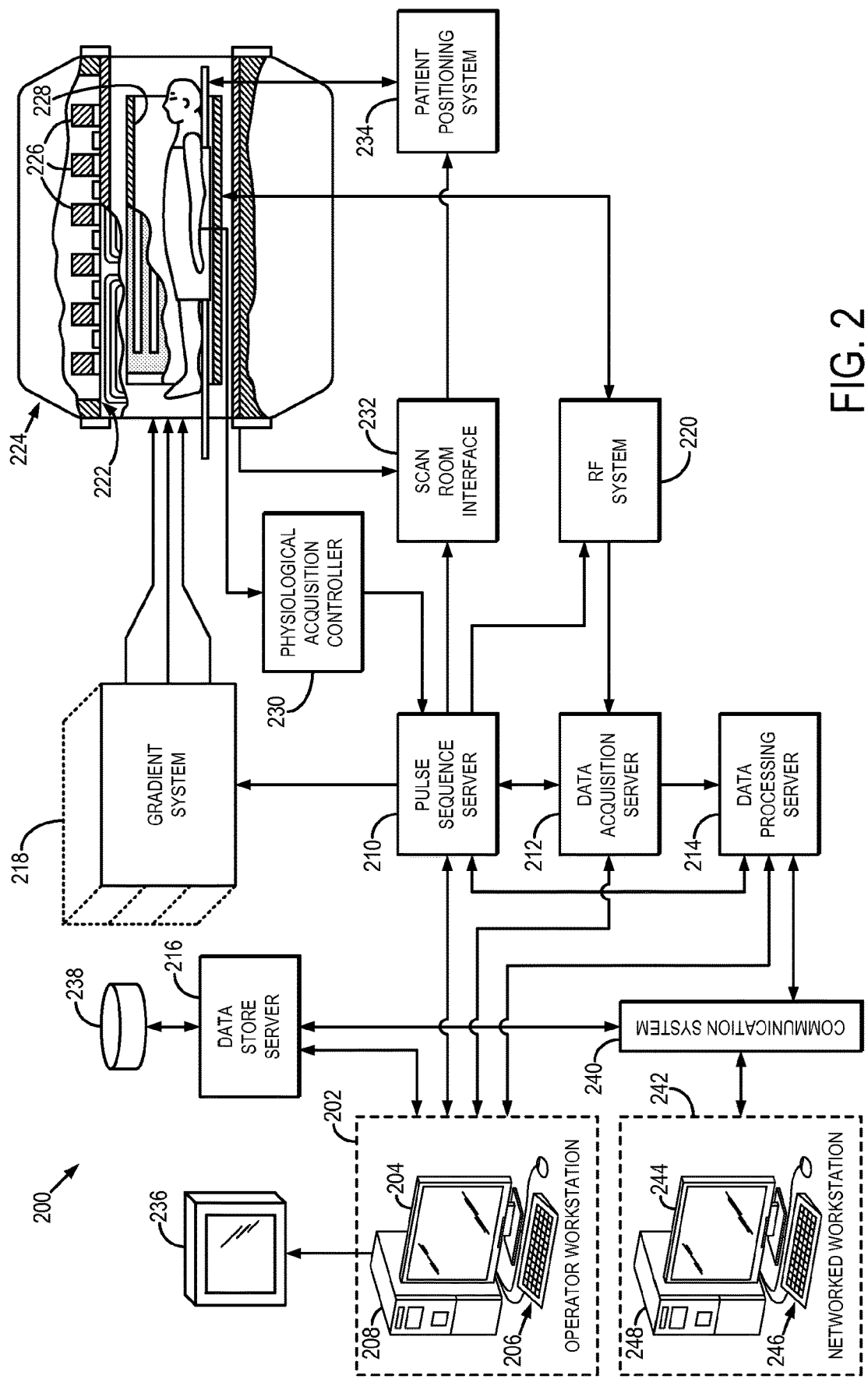
FIG. 2 is a block diagram of an example of a magnetic resonance imaging ("MRI") system.

Referring particularly now to FIG. 2, an example of a magnetic resonance imaging ("MRI") system 200 is illustrated. The MRI system 200 includes an operator workstation 202, which will typically include a display 204; one or more input devices 206, such as a keyboard and mouse; and a processor 208. The processor 208 may include a commercially available programmable machine running a commercially available operating system. The operator workstation 202 provides the operator interface that enables scan prescriptions to be entered into the MRI system 200. In general, the operator workstation 202 may be coupled to four servers: a pulse sequence server 210; a data acquisition server 212; a data processing server 214; and a data store server 216. The operator workstation 202 and each server 210, 212, 214, and 216 are connected to communicate with each other. For example, the servers 210, 212, 214, and 216 may be connected via a communication system 240, which may include any suitable network connection, whether wired, wireless, or a combination of both. As an example, the communication system 240 may include both proprietary or dedicated networks, as well as open networks, such as the internet.

The pulse sequence server 210 functions in response to instructions downloaded from the operator workstation 202 to operate a gradient system 218 and a radiofrequency ("RF") system 220. Gradient waveforms necessary to perform the prescribed scan are produced and applied to the gradient system 218, which excites gradient coils in an assembly 222 to produce the magnetic field gradients $G_x$, $G_y$, and $G_z$ used for position encoding magnetic resonance signals. The gradient coil assembly 222 forms part of a magnet assembly 224 that includes a polarizing magnet 226 and a whole-body RF coil 228.

RF waveforms are applied by the RF system 220 to the RF coil 228, or a separate local coil (not shown in FIG. 2), in order to perform the prescribed magnetic resonance pulse sequence. Responsive magnetic resonance signals detected by the RF coil 228, or a separate local coil (not shown in FIG. 2), are received by the RF system 220, where they are amplified, demodulated, filtered, and digitized under direction of commands produced by the pulse sequence server 210. The RF system 220 includes an RF transmitter for producing a wide variety of RF pulses used in MRI pulse sequences. The RF transmitter is responsive to the scan prescription and direction from the pulse sequence server 210 to produce RF pulses of the desired frequency, phase, and pulse amplitude waveform. The generated RF pulses may be applied to the whole-body RF coil 228 or to one or more local coils or coil arrays (not shown in FIG. 2).

The RF system 220 also includes one or more RF receiver channels. Each RF receiver channel includes an RF preamplifier that amplifies the magnetic resonance signal received by the coil 228 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad (4);$$

and the phase of the received magnetic resonance signal may also be determined according to the following relationship:

$$\varphi = \tan^{-1}\left(\frac{Q}{I}\right). \qquad (5)$$

The pulse sequence server 210 also optionally receives patient data from a physiological acquisition controller 230. By way of example, the physiological acquisition controller 230 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 210 to synchronize, or "gate," the performance of the scan with the subject's heart beat or respiration.

The pulse sequence server 210 also connects to a scan room interface circuit 232 that receives signals from various sensors associated with the condition of the patient and the magnet system. It is also through the scan room interface circuit 232 that a patient positioning system 234 receives commands to move the patient to desired positions during the scan.

The digitized magnetic resonance signal samples produced by the RF system 220 are received by the data acquisition server 212. The data acquisition server 212 operates in response to instructions downloaded from the operator workstation 202 to receive the real-time magnetic resonance data and provide buffer storage, such that no data is lost by data overrun. In some scans, the data acquisition server 212 does little more than pass the acquired magnetic resonance data to the data processor server 214. However, in scans that require information derived from acquired magnetic resonance data to control the further performance of the scan, the data acquisition server 212 is programmed to produce such information and convey it to the pulse sequence server 210. For example, during prescans, magnetic resonance data is acquired and used to calibrate the pulse sequence performed by the pulse sequence server 210. As another example, navigator signals may be acquired and used to adjust the operating parameters of the RF system 220 or the gradient system 218, or to control the view order in which k-space is sampled. In still another example, the data acquisition server 212 may also be employed to process magnetic resonance signals used to detect the arrival of a contrast agent in a magnetic resonance angiography ("MRA") scan. By way of example, the data acquisition server 212 acquires magnetic resonance data and processes it in real-time to produce information that is used to control the scan.

The data processing server 214 receives magnetic resonance data from the data acquisition server 212 and processes it in accordance with instructions downloaded from the operator workstation 202. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 214 are conveyed back to the operator workstation 202 where they are stored. Real-time images are stored in a data base memory cache (not shown in FIG. 2), from which they may be output to operator display 212 or a display 236 that is located near the magnet assembly 224 for use by attending physicians. Batch mode images or selected real time images are stored in a host database on disc storage 238. When such images have been reconstructed and transferred to storage, the data processing server 214 notifies the data store server 216 on the operator workstation 202. The operator workstation 202 may be used by an operator to archive the images, produce films, or send the images via a network to other facilities.

The MRI system 200 may also include one or more networked workstations 242. By way of example, a networked workstation 242 may include a display 244; one or more input devices 246, such as a keyboard and mouse; and a processor 248. The networked workstation 242 may be located within the same facility as the operator workstation 202, or in a different facility, such as a different healthcare institution or clinic.

The networked workstation 242, whether within the same facility or in a different facility as the operator workstation 202, may gain remote access to the data processing server 214 or data store server 216 via the communication system 240. Accordingly, multiple networked workstations 242 may have access to the data processing server 214 and the data store server 216. In this manner, magnetic resonance data, reconstructed images, or other data may be exchanged between the data processing server 214 or the data store server 216 and the networked workstations 242, such that the data or images may be remotely processed by a networked workstation 242. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image, in which background phase variations are removed, from data acquired using a magnetic resonance imaging (MRI) system, the steps of the method comprising:

(a) providing diffusion-weighted data that was acquired with the MRI system;
(b) reconstructing a complex-valued image from the provided data;
(c) estimating background phase variations based on the reconstructed complex-valued image, the background phase variations caused by at least a physiological source of motion; and
(d) producing a complex-valued, phase-corrected image by removing the estimated background phase variations from the reconstructed complex-valued image by applying a multiplicative factor based on the estimated background phase variations to the reconstructed complex-valued images and wherein the multiplicative factor is based on a ratio between a complex conjugate of the estimated background phase variations and a magnitude of the estimated background phase variations.

2. The method as recited in claim 1, wherein step (c) includes estimating the background phase variations using at least one of a smoothing algorithm and a denoising algorithm that is designed to produce an image having a phase component equal to the background phase variations.

3. The method as recited in claim 2, wherein the denoising algorithm includes an L1-regularized total variation minimization.

4. The method as recited in claim 2, wherein the at least one of a smoothing algorithm and a denoising algorithm comprises applying a filter to the reconstructed image.

5. The method as recited in claim 4, wherein the filter is a median filter.

6. The method as recited in claim 1, further comprising producing a real-valued, phase-corrected image by extracting a real-valued component of the complex-valued, phase-corrected image.

7. The method as recited in claim 1, wherein step (d) includes subtracting the estimated background phase variations from the reconstructed complex-valued image.

8. A method for producing an image, in which background phase variations are removed, from data acquired using a magnetic resonance imaging (MRI) system, the steps of the method comprising:
(a) providing data that was acquired with the MRI system;
(b) reconstructing a complex-valued image from the provided data;
(c) estimating background phase variations based on the reconstructed complex-valued image, the background phase variations caused by at least a physiological source of motion; and
(d) producing a phase-corrected image by removing the estimated background phase variations from the reconstructed complex-valued image by applying a multiplicative factor based on the estimated background phase variations to the reconstructed complex-valued images and wherein the multiplicative factor is based on a ratio between a complex conjugate of the estimated background phase variations and a magnitude of the estimated background phase variations.

9. The method as recited in claim 8, wherein step (c) includes estimating the background phase variations using at least one of a smoothing algorithm and a denoising algorithm that is designed to produce an image having a phase component equal to the background phase variations.

10. The method as recited in claim 9, wherein the denoising algorithm includes an L1-regularized total variation minimization.

11. The method as recited in claim 9, wherein the at least one of the smoothing algorithm and the denoising algorithm comprises applying a filter to the reconstructed image.

12. The method as recited in claim 11, wherein the filter is a median filter.

13. The method as recited in claim 8, wherein the data provided in step (a) is diffusion-weighted data.

14. The method as recited in claim 8, wherein the data provided in step (a) is dynamic susceptibility-weighted data.

* * * * *